US008610489B2

(12) United States Patent
Daigle et al.

(10) Patent No.: US 8,610,489 B2
(45) Date of Patent: Dec. 17, 2013

(54) DEPLETION-MODE CIRCUIT

(75) Inventors: Tyler Daigle, Portland, ME (US); Julie Lynn Stultz, Scarborough, ME (US); Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/471,832

(22) Filed: May 15, 2012

(65) Prior Publication Data

US 2013/0307591 A1    Nov. 21, 2013

(51) Int. Cl.
H03K 17/56    (2006.01)
(52) U.S. Cl.
USPC ................. 327/419; 327/427; 327/430
(58) Field of Classification Search
USPC .............. 327/419–420, 427, 430, 536, 537
See application file for complete search history.

(56) References Cited

U.S. PATENT DOCUMENTS

| | | | |
|---|---|---|---|
| 3,908,136 A | 9/1975 | Desperques-Volmier | |
| 4,093,874 A | 6/1978 | Pollitt | |
| 4,835,649 A | 5/1989 | Salerno | |
| 5,539,610 A | 7/1996 | Williams et al. | |
| 6,469,564 B1 | 10/2002 | Jansen | |
| 6,504,424 B1 | 1/2003 | Heminger et al. | |
| 7,782,117 B2 | 8/2010 | Stultz et al. | |
| 8,009,395 B2 * | 8/2011 | Graves et al. | 361/56 |
| 8,502,595 B2 | 8/2013 | Stultz et al. | |
| 2011/0260780 A1 * | 10/2011 | Granger-Jones et al. | 327/537 |
| 2012/0242397 A1 | 9/2012 | Stultz et al. | |
| 2013/0154720 A1 | 6/2013 | Snowdon | |

FOREIGN PATENT DOCUMENTS

KR    1020120109388 A    10/2012

OTHER PUBLICATIONS

"U.S. Appl. No. 13/428,218, Notice of Allowance mailed Apr. 2, 2013", 10 pgs.
"Chinese Application Serial No. 201220143522.3, Notification to Make Rectification mailed Aug. 30, 2012", 1 pg.
"Chinese Application Serial No. 201220143522.3, Response filed Aug. 31, 2012 to Notification to Make Rectification mailed Aug. 30, 2012", 23 pgs.
"Chinese Application Serial No. 201220710553.2, Notification to Make Rectification mailed Apr. 10, 2013", 2 pgs.
"Chinese Application Serial No. 201220710553.2, Response filed Apr. 15, 2013 to Notification to Make Rectification mailed Apr. 10, 2013", 5 pgs.

* cited by examiner

*Primary Examiner* — An Luu
(74) *Attorney, Agent, or Firm* — Schwegman Lundberg & Woessner, P.A.

(57) ABSTRACT

This document discloses, among other things, a switch circuit that includes a depletion-mode field-effect transistor (DMFET) having an ON-state and an OFF-state, wherein the DMFET is configured to couple a first node to a second node in the ON-state, and wherein the DMFET is configured to isolate the first node from the second node in the OFF-state, a negative charge pump that is coupled to a gate terminal of the DMFET, the charge pump configured to supply a negative charge pump voltage to the gate terminal of the DMFET, and a negative discriminator coupled to the charge pump, the discriminator configured to compare a first voltage at the first node and a second voltage at the second node and determine the negative charge pump voltage based on the comparison.

20 Claims, 2 Drawing Sheets

DEPLETION-MODE CIRCUIT

BACKGROUND

Electronic circuits and systems often include analog switches configured to couple analog signals to or to isolate analog signals from a circuit path. In contrast, digital switches can be configured to change output states in response to an input, but do not pass received signals from an input to an output.

OVERVIEW

In an example, a depletion-mode device, e.g., a depletion-mode field-effect transistor (DMFET), can be used to switch signals that alternate between positive and negative voltages (or "swing negative"), such as audio signals. In an example, this documents discloses an analog switch circuit including a DMFET having an ON-state (a "low" impedance state) and an OFF-state (a "high" impedance state), wherein the DMFET is configured to couple a first node to a second node in the ON-state and to isolate the first node from the second node in the OFF-state. In an example, the switch circuit can include a negative charge pump coupled to a gate terminal of the DMFET, the charge pump configured to supply a negative charge pump voltage to the gate terminal of the DMFET, and a negative discriminator coupled to the charge pump, the discriminator configured to compare a first voltage at the first node and a second voltage at the second node and determine the negative charge pump voltage based on the comparison.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Conducting a signal between two circuit nodes is one of many transistor switch applications. In some applications, it can be desirable to use a depletion-mode device, e.g., a depletion-mode field-effect transistor (DMFET), as an analog switch. A DMFET, for example, has a negative threshold voltage ($V_T$) and, as such, can conduct when its gate-source voltage ($V_{GS}$) is 0 volts (V). As such, without power, the DMFET is in an ON-state and can conduct from a first node connected to a drain terminal of the DMFET to a second node connected to a source terminal of the DMFET.

Because the DMFET has a negative $V_T$, $V_{GS}$ should be less than $-V_T$ to ensure that the DMFET is or remains in an OFF-state. Existing techniques apply a fixed negative voltage, e.g., via an external negative source or fixed negative charge pump. However, if a DMFET is used as a switch and the switch signal swings negative and approaches a value near the voltage applied to the gate terminal, then a positive overdrive voltage, e.g., the voltage between $V_{GS}$ and $V_T$, can begin to undesirably turn the switch to an ON-state. That is, a negative switch signal at the source terminal of the switch that approaches the voltage applied to the gate terminal of the switch can result in a 0 V $V_{GS}$, which can turn the switch to an ON-state due to the $-V_T$ of the DMFET. Thus, an external negative source or fixed negative charge pump, as in existing techniques, do not ensure that the depletion-mode device can remain in an OFF-state if a negative voltage is applied to the source terminal of the switch.

The present inventors have recognized, among other things, techniques that allow a depletion mode device, e.g., a DMFET with a negative $V_T$, to act as a switch in systems or circuits that have signals that alternate between positive and negative voltages (or "swing negative"). Using the techniques of this disclosure, a negative discriminator can determine the most negative voltage in a system and a charge pump can convert the determined voltage into a lower voltage, e.g., by about 2.5 V, and can apply the converted voltage to the gate of the switch, thereby ensuring that switch remains in an OFF-state, where $V_{GS}$ of the depletion device is less than $-V_T$ of the depletion device, even when the voltage at the switch is negative. In this manner, the techniques of this disclosure ensure that the depletion-mode device has a constant OFF-state $V_{GS}$.

Figure 1:
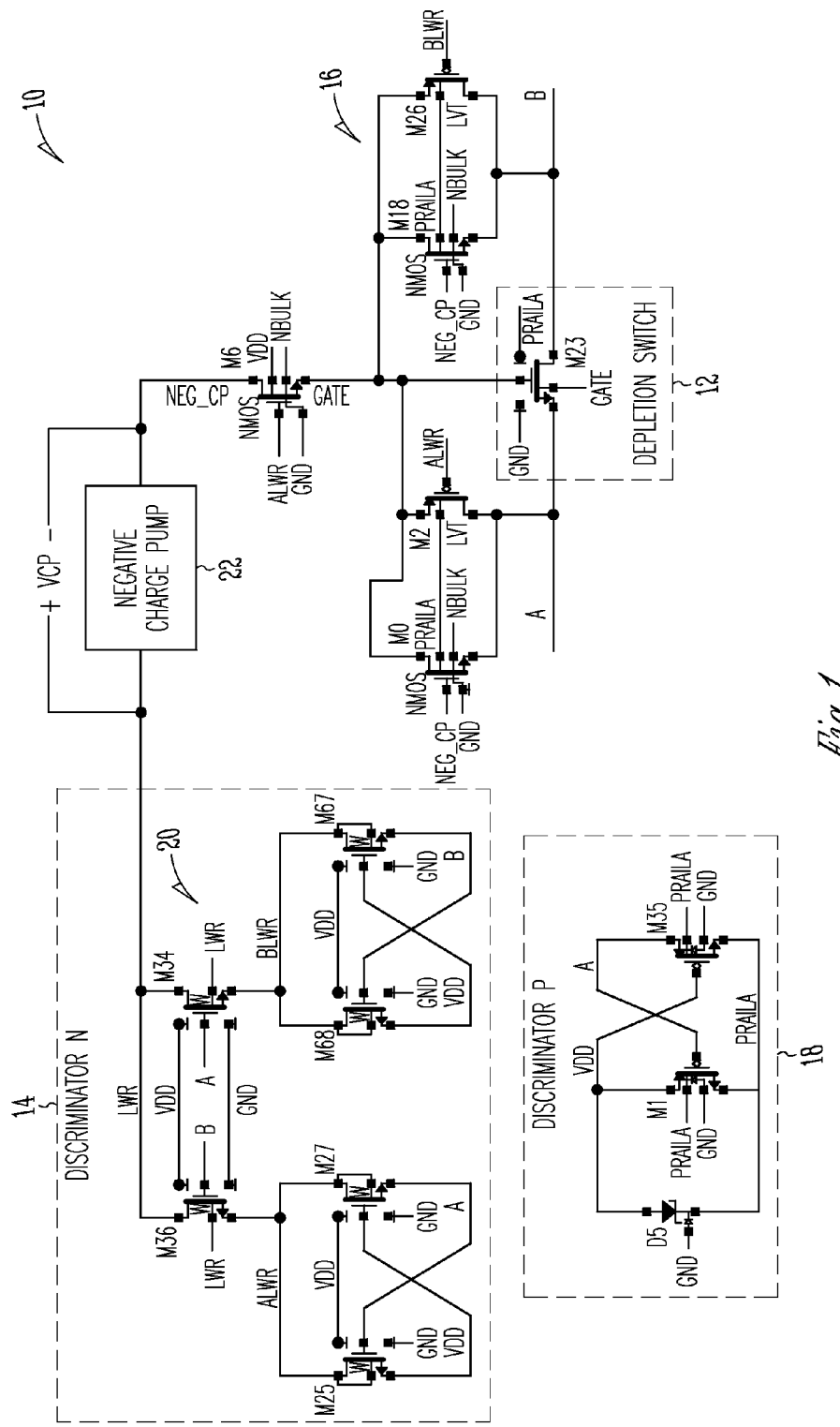
FIG. 1 illustrates generally an example switch circuit configured to maintain a depletion-mode switch in an OFF-state when a negative signal is applied to the depletion-mode switch.

FIG. 1 illustrates generally an example switch circuit 10 configured to maintain a depletion-mode switch 12 in an OFF-state when a negative signal is applied to the depletion-mode switch 12, in accordance with this disclosure. Generally speaking, using various techniques of this disclosure, the example switch circuit 10 of FIG. 1 can use a discriminator 14 to find the lowest voltage between the power supply rail and one or more switch ports, and can convert the lowest voltage into a lower voltage for application to the gate terminal of the depletion-mode switch 12.

As indicated above, the depletion-mode switch 12, e.g., a DMFET, is in an ON-state when power is OFF and is in an OFF-state when power is ON. The depletion-mode switch 12 can be configured to isolate a first node from a second node in the OFF-state and to couple the first node to the second node in the ON-state. That is, the depletion-mode switch 12 can conduct between node A, connected to a source terminal of the depletion-mode switch 12, and node B, connected to a drain terminal of the depletion-mode switch 12, when the power ($V_{dd}$) is OFF, as described in detail below.

The discriminator 14 can be configured to compare a first voltage at a first node and a second voltage at a second node and determine a negative charge pump voltage based on the comparison. In other words, the discriminator 14 can include a negative discriminator configured to compare multiple voltages and determine which of the multiple voltages is the lowest.

The discriminator can include transistors M25, M27 configured to compare two voltages, namely the power supply rail $V_{dd}$ and the voltage at node A of the depletion-mode switch 12, to determine the lower of the two voltages ("alwr"). When the depletion-mode switch 12 is in an ON-state, $V_{dd}$ is OFF, e.g., 0 V. Thus, the configuration of the transistors M25, M27 of the discriminator 14 can determine that $V_{dd}$ is the lower voltage between $V_{dd}$ and the voltage at node A of the depletion-mode switch 12 and, as such, "alwr" can equal $V_{dd}$, or 0 V.

Similarly, the discriminator 14 can include transistors M67, M68 configured to compare two voltages, namely $V_{dd}$ and the voltage at node B of the depletion-mode switch 12, to determine the lower of the two voltages ("blwr"). Further, the discriminator 14 can include transistors M34, M36 configured to compare the voltage "alwr" and the voltage "blwr" to determine the lower of the two voltages ("lwr"). The discriminator 14 can be coupled to the negative charge pump 22.

In one example implementation, a top portion 20 of the discriminator 14 including the transistors M34, M36 may not be needed. If one side of the depletion-mode switch 12 is assumed to drive the depletion-mode switch 12, then either "alwr" or "blwr" can be converted instead of "lwr." For example, if node A of the depletion-mode switch 12 should be isolated from node B of the depletion-mode switch 12 and there is a signal on node A and node B is either floating or pulled to ground, then the only signal that can swing negative is the signal on node A. In this example, the top portion 20 of the discriminator 14 is not needed because only node A can have a negative signal. Thus, the discriminator 14 converts "alwr."

In the example configuration shown in FIG. 1, the negative charge pump 22 can be coupled to a gate terminal of the depletion-mode switch 12. The charge pump 22 can be configured to supply a negative charge pump voltage, e.g., at about 2.5 V below the most negative voltage of the system, to the gate terminal of the depletion-mode switch 12. More particularly, the negative charge pump 22 can be configured to supply the negative charge pump voltage to the gate terminal of the depletion-mode switch 12, where the voltage between the gate terminal and the source terminal of the depletion-mode switch 12 is less than the threshold voltage of the depletion-mode switch 12, thereby ensuring that the depletion-mode switch 12 is in the OFF-state.

In an example, the switch circuit 10 can include a transistor M6 connected between the negative charge pump 22 and the depletion-mode switch 12. When the depletion-mode switch 12 is in an ON-state, e.g., $V_{dd}$ is OFF, the transistor M6, e.g., an n-type metal-oxide-semiconductor (MOS) FET, is OFF, and thus not conducting, because the voltage at its gate terminal, namely "alwr", is 0 V.

The example switch circuit 10 can further include gate driver circuitry connected to the drain terminal of the transistor M6. In the example shown in FIG. 1, the gate driver circuitry can be a complimentary MOS (CMOS) switch, formed by transistors M0, M2, M18, M26. The CMOS switch, shown generally at 16, is enabled when $V_{dd}$ is OFF. The CMOS switch 16 can conduct when enabled, thereby ensuring that the voltage at the gate terminal of the depletion-mode switch 12 can track the voltage at nodes A, B of the depletion-mode switch 12. In this manner, the CMOS switch 16 can apply a substantially constant 0 V $V_{GS}$ to the depletion-mode switch 12, thus ensuring that the depletion-mode switch 12 remains ON.

The switch circuit 10 of FIG. 1 can further include a positive discriminator 18 that can include transistors M1, M35. As seen in FIG. 1, the positive discriminator 18 can be coupled to the gate driver circuitry, e.g., the CMOS switch 16. The positive discriminator 18 can compare a first voltage and a second voltage in order to determine which voltage is higher. More particularly, the configuration of the transistors M1, M35 of the positive discriminator 18 can compare $V_{dd}$, e.g., a first voltage, and the voltage at node A of the depletion-mode switch 12, e.g., a second voltage, to determine the higher of the two voltages ("Praila").

The positive discriminator 18 can be connected to the n-wells of the transistors of the CMOS switch 16, namely the transistors M0, M18. It can be desirable to apply the most positive voltage to the n-wells of the transistors M0, M18 to prevent the P-N junctions of the transistors M0, M18 from leaking.

In some example configurations, two positive discriminators can be used. In such a configuration, the second positive discriminator (not depicted) can compare $V_{dd}$ and the voltage at node B for situations in which node B is driving. One positive discriminator is shown in FIG. 1 because, if the depletion-mode switch 12 is ON, the voltages at nodes A, B will be the same.

To isolate node A from node B, the depletion-mode switch 12 can be turned to an OFF-state by turning $V_{dd}$ ON. Although $V_{dd}$ is described throughout this disclosure as a power supply rail, in other example implementations, $V_{dd}$ can be a control line that can be controlled. However, the following description is based on $V_{dd}$ being a power supply rail, such that the depletion-mode switch 12 can be in an ON-state when there is no power and in an OFF-state when power is applied.

When $V_{dd}$ is applied to isolate node A from node B, voltages "alwr" and "blwr," as determined by the transistors M25, M27 and the transistors M67, M68 of the negative discriminator 14, respectively, can be about equal to the actual voltages present at nodes A, B on the depletion-mode switch 12 because the voltages present at nodes A, B should be lower than $V_{dd}$. The top portion of the negative discriminator 14, shown generally at 20, can determine the lower voltage between "alwr" and "blwr" and apply that lower voltage to the negative charge pump 22. In other words, the negative charge pump 22 can convert down the most negative signal at the depletion-mode switch 12, e.g., by about 2.5V, resulting in a charge pump voltage of negative $V_{CP}$ ($-V_{CP}$).

The charge pump voltage of $-V_{CP}$ turns the transistor M6 to an ON-state. The transistor M6 turns to an ON-state because the $V_{GS}$ of the transistor M6 is positive as a result of the charge pump 22 converting the lower of "alwr" and "blwr" to a lower voltage. When $V_{dd}$ is applied, the CMOS switch 16 formed by the transistors M0, M2, M18, M26 is OFF. More particularly, the transistors M0, M18 are each in an OFF-state because their gates are connected to $-V_{CP}$, and the transistors M2, M26 are each in an OFF-state because their gates are connected to voltages at nodes A, B of the depletion-mode switch 12.

Figure 2:
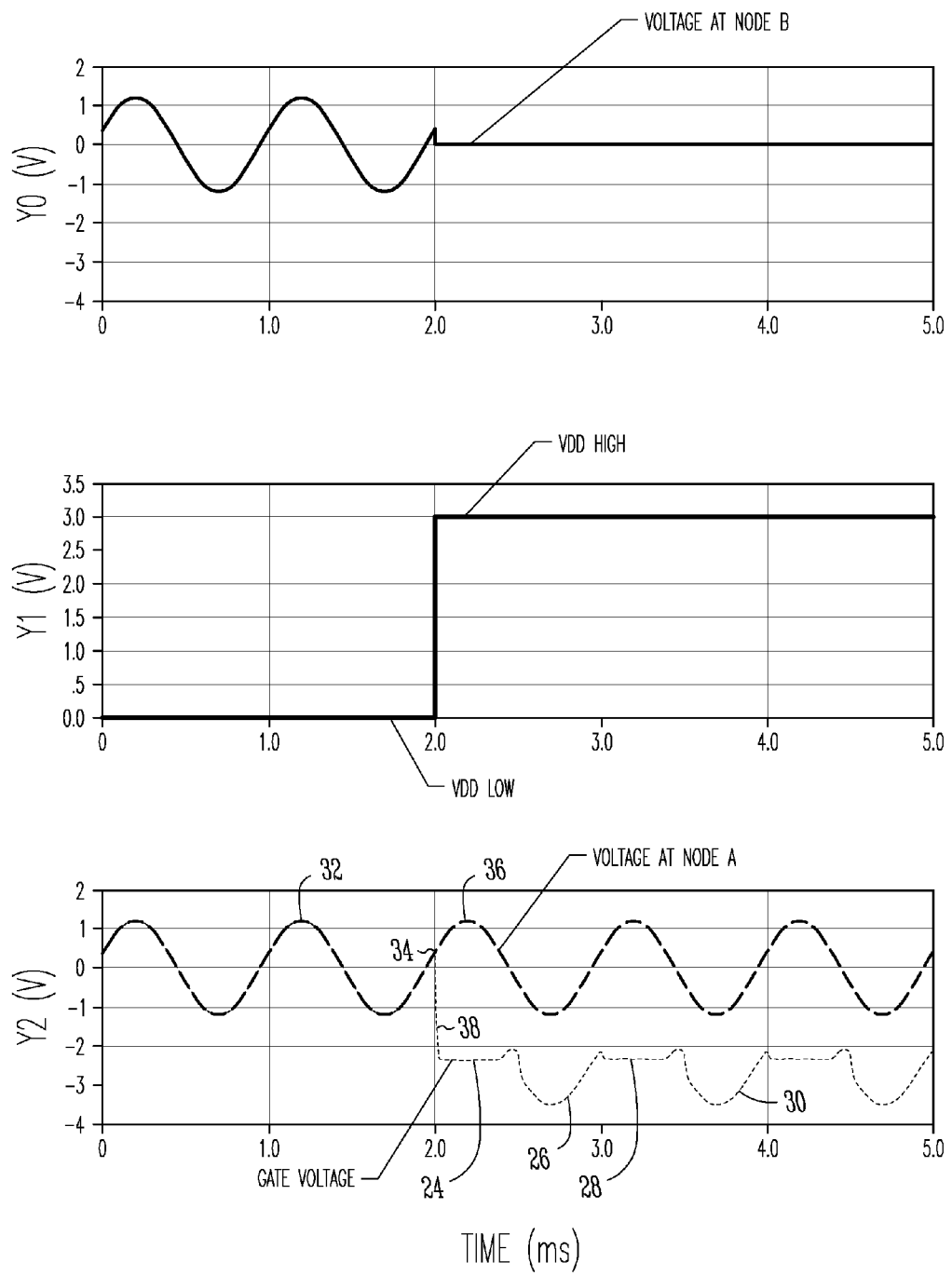
FIG. 2 illustrates generally three waveform diagrams related to the operation of the example switch circuit of FIG. 1.

FIG. 2 illustrates generally three waveform diagrams related to the operation of the example switch circuit 10 of FIG. 1. In all three diagrams, the y-axis represents voltage in volts and the x-axis represents time in milliseconds. The middle diagram illustrates $V_{dd}$. When $V_{dd}$ is low, e.g., 0 V, the depletion-mode switch 12 is in an ON-state and when $V_{dd}$ is high, e.g., about 3 V, at about 2 ms in FIG. 2, the depletion-mode switch 12 is in an OFF-state. The top diagram illustrates the signal at node B of the depletion-mode switch 12 before and after $V_{dd}$ is applied at about 2 ms. The bottom diagram illustrates the signal at node A of the depletion-mode switch 12 before and after $V_{dd}$ is applied at about 2 ms.

Prior to isolation, from 0 to about 2 ms, both nodes A and B have signals thereon because $V_{dd}$ is low and thus the depletion-mode switch 12 is in an ON-state. In one example, before $V_{dd}$ is asserted, the constant 0 $V_{GS}$ circuitry of the CMOS switch 16 (formed by the transistors M0, M2, M18, M26) is active, providing the depletion-mode switch 12 with a low ON resistance and low total harmonic distortion. As seen in the bottom diagram at 32, prior to $V_{dd}$ being asserted at about 2 ms (identified by reference number 34), the gate voltage 38 tracks the voltage at node A 36 due to the CMOS switch 16 being active (the gate voltage and the voltage at node A are overlaid on top of each other.)

Once $V_{dd}$ is applied at 34, the negative discriminator 14 activates and determines the most negative voltage between $V_{dd}$ and the voltage at nodes A, B. The charge pump 22 converts down the determined most negative voltage. Referring to the three diagrams of FIG. 2 after $V_{dd}$ is applied at about 2 ms, during the positive half cycle of the voltage at node A, the voltage at node B is at about 0 V and, as such, the voltage at node B is the most negative voltage between $V_{dd}$ and the voltage at nodes A, B. The charge pump 22 converts down the determined most negative voltage of 0 V by a voltage level, e.g., by about 2.5 V in this example implementation. Thus, for the first half cycle of the voltage at node A, the gate voltage 38 of the depletion-mode switch 12 shown in the bottom diagram is flat and at about negative 2.5 V, as shown at 24.

During the second half cycle of the voltage at node A when the voltage at node A 36 goes below the voltage at node B, the voltage at node A is the most negative voltage between $V_{dd}$ and the voltage at nodes A, B. The charge pump 22 converts down the voltage at node A by about 2.5 V. Thus, for the second half cycle of the voltage at node A, the gate voltage of the depletion-mode switch 12 shown in the bottom diagram generally tracks 2.5 V lower than the voltage at node A, as shown at 26. The behavior of the gate voltage of the switch 10 during subsequent half cycles, e.g., as shown at 28, 30, is similar and, for purposes of conciseness, will not be described again.

In this manner, the depletion-mode switch 12 has a negative $V_{GS}$ applied to it that is below $V_T$ using the techniques of this disclosure. Hence, the depletion-mode switch 12 can remain in an OFF-state despite the negative swinging signal(s) at the nodes A, B of the depletion-mode switch 12.

ADDITIONAL NOTES AND EXAMPLES

In Example 1, a switch circuit comprises a depletion-mode field-effect transistor (DMFET) having an ON-state and an OFF-state, wherein the DMFET is configured to couple a first node to a second node in the ON-state, and wherein the DMFET is configured to isolate the first node from the second node in the OFF-state. The switch circuit further comprises a negative charge pump that is coupled to a gate terminal of the DMFET, the charge pump configured to supply a negative charge pump voltage to the gate terminal of the DMFET. The switch circuit further comprises a negative discriminator coupled to the charge pump, the discriminator configured to compare a first voltage at the first node and a second voltage at the second node and determine the negative charge pump voltage based on the comparison.

In Example 2, the DMFET of the switch circuit of Example 1 optionally comprises a source terminal, and the negative charge pump is optionally configured to supply the negative charge pump voltage to the gate terminal, where the voltage between the gate terminal and the source terminal of the DMFET is less than a threshold voltage of the DMFET, to ensure that the DMFET is in the OFF-state.

In Example 3, the negative discriminator of the switch circuit of any one or more of Examples 1-2 is optionally configured to determine a first negative voltage between a power supply voltage and the first voltage at the first node, wherein the first negative voltage is the lesser of the power supply voltage and the first voltage, and determine a second negative voltage between the power supply voltage and the second voltage at the second node, wherein the second negative voltage is the lesser of the power supply voltage and the second voltage.

In Example 4, the negative discriminator of the switch circuit of Example 3 is optionally further configured to determine a third negative voltage between the first negative voltage and the second negative voltage, wherein the third negative voltage is the lesser of the first negative voltage and the second negative voltage.

In Example 5, the DMFET of the switch circuit of any one or more of Examples 1-4 is optionally configured as an n-type metal-oxide-semiconductor FET.

In Example 6, the DMFET of the switch circuit of any one or more of Examples 1-5 optionally comprises a source terminal, and the switch circuit optionally comprises gate driver circuitry configured to provide a substantially constant voltage between the gate terminal and the source terminal when the DMFET is in the ON-state.

In Example 7, the switch circuit of any one or more of Examples 1-6 optionally further comprises a positive discriminator coupled to the gate driver circuitry, the positive discriminator configured to determine a first positive voltage between a power supply voltage and the first voltage at the first node, wherein the first positive voltage is the greater of the power supply voltage and the first voltage.

In Example 8, a device comprises a switch circuit. The switch circuit comprises a depletion-mode field-effect transistor (DMFET) having an ON-state and an OFF-state, wherein the DMFET is configured to couple a first node to a second node in the ON-state, and wherein the DMFET is configured to isolate the first node from the second node in the OFF-state. The switch circuit further comprises a negative charge pump that is coupled to a gate terminal of the DMFET, the charge pump configured to supply a negative charge pump voltage to the gate terminal of the DMFET. The switch circuit further comprises a negative discriminator coupled to the charge pump, the discriminator configured to compare a first voltage at the first node and a second voltage at the second node and determine the negative charge pump voltage based on the comparison.

In Example 9, the DMFET of the device of Example 8 optionally comprises a source terminal, and the negative charge pump is optionally configured to supply the negative charge pump voltage to the gate terminal, where the voltage between the gate terminal and the source terminal of the DMFET is less than a threshold voltage of the DMFET, to ensure that the DMFET is in the OFF-state.

In Example 10, the negative discriminator of the device of any one or more of Examples 8-9 is optionally configured to determine a first negative voltage between a power supply voltage and the first voltage at the first node, wherein the first negative voltage is the lesser of the power supply voltage and the first voltage, and determine a second negative voltage between the power supply voltage and the second voltage at the second node, wherein the second negative voltage is the lesser of the power supply voltage and the second voltage.

In Example 11, the negative discriminator of the device of Example 10 is optionally further configured to determine a third negative voltage between the first negative voltage and the second negative voltage, wherein the third negative voltage is the lesser of the first negative voltage and the second negative voltage.

In Example 12, the DMFET of the device of any one or more of Examples 8-11 is an n-type metal-oxide-semiconductor FET.

In Example 13, the DMFET of the device of any one or more of Examples 8-12 optionally comprises a source terminal, the switch circuit of any one or more of Examples 8-12 further comprising gate driver circuitry configured to provide a substantially constant voltage between the gate terminal and the source terminal when the DMFET is in the ON-state.

In Example 14, the device of any one or more of Examples 8-13 optionally further comprises a positive discriminator coupled to the gate driver circuitry, the positive discriminator configured to determine a first positive voltage between a power supply voltage and the first voltage at the first node, wherein the first positive voltage is the greater of the power supply voltage and the first voltage.

In Example 15, a method for operating a switch circuit, the method comprising determining a negative charge pump voltage based on a comparison of a first voltage at a first node of a depletion-mode field-effect transistor (DMFET) and a second voltage at a second node of the DMFET, wherein the DMFET has an ON-state and an OFF-state, wherein the DMFET is configured to couple the first node to the second node in the ON-state, and wherein the DMFET is configured to isolate the first node from the second node in the OFF-state. The method further comprising generating the negative charge pump voltage. The method further comprising supplying the negative charge pump voltage to a gate terminal of the DMFET.

In Example 16, the determining the negative charge pump voltage of Example 15 is optionally performed by a negative discriminator, and the generating the negative charge pump voltage is optionally performed by a negative charge pump, where an output of the negative charge pump applies the negative charge pump voltage to a gate terminal of the DMFET, and where the DMFET is an n-type metal-oxide-semiconductor FET.

In Example 17, the method of any one or more of Examples 15-16, the DMFET optionally comprises a source terminal, and supplying the negative charge pump voltage to a gate terminal of the DMFET optionally comprises supplying the negative charge pump voltage to the gate terminal, wherein the voltage between the gate terminal and the source terminal of the DMFET is less than a threshold voltage of the DMFET, to ensure that the DMFET is in the OFF-state.

In Example 18, the method of any one or more of Examples 15-17, the determining a negative charge pump voltage optionally further comprises determining a first negative voltage between a power supply voltage and the first voltage at the first node, wherein the first negative voltage is the lesser of the power supply voltage and the first voltage, determining a second negative voltage between the power supply voltage and the second voltage at the second node, wherein the second negative voltage is the lesser of the power supply voltage and the second voltage, and determining a third negative voltage between the first negative voltage and the second negative voltage, wherein the third negative voltage is the lesser of the first negative voltage and the second negative voltage.

In Example 19, the method of any one or more of Examples 15-18, where the DMFET optionally comprises a source terminal, and the method optionally further comprises providing a substantially constant voltage between the gate terminal and the source terminal when the DMFET is in the ON-state.

In Example 20, the method of any one or more of Examples, 15-19, where providing a substantially constant voltage between the gate terminal and the source terminal optionally comprises determining a first positive voltage between a power supply voltage and the first voltage at the first node, wherein the first positive voltage is the greater of the power supply voltage and the first voltage, and applying the first positive voltage to gate driver circuitry.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A switch circuit comprising:
a depletion-mode field-effect transistor (DMFET) having an ON-state and an OFF-state, wherein the DMFET is configured to couple a first node to a second node in the ON-state, and wherein the DMFET is configured to isolate the first node from the second node in the OFF-state;
a negative charge pump that is coupled to a gate terminal of the DMFET, the charge pump configured to supply a negative charge pump voltage to the gate terminal of the DMFET; and
a negative discriminator coupled to the charge pump, the discriminator configured to compare a first voltage at the first node and a second voltage at the second node and to determine the negative charge pump voltage based on the comparison.

2. The switch circuit of claim 1, wherein the DMFET comprises a source terminal, and wherein the negative charge pump is configured to supply the negative charge pump voltage to the gate terminal, wherein the voltage between the gate terminal and the source terminal of the DMFET is less than a threshold voltage of the DMFET, to ensure that the DMFET is in the OFF-state.

3. The switch circuit of claim 1, wherein the negative discriminator configured to determine the negative charge pump voltage based on a comparison of a first voltage at the first node and a second voltage at the second node is configured to:
determine a first negative voltage between a power supply voltage and the first voltage at the first node, wherein the first negative voltage is the lesser of the power supply voltage and the first voltage; and
determine a second negative voltage between the power supply voltage and the second voltage at the second node, wherein the second negative voltage is the lesser of the power supply voltage and the second voltage.

4. The switch circuit of claim 3, wherein the negative discriminator is further configured to:
determine a third negative voltage between the first negative voltage and the second negative voltage, wherein the third negative voltage is the lesser of the first negative voltage and the second negative voltage.

5. The switch circuit of claim 1, wherein the DMFET is an n-type metal-oxide-semiconductor FET.

6. The switch circuit of claim 1, wherein the DMFET comprises a source terminal, the switch circuit further comprising gate driver circuitry configured to provide a substantially constant voltage between the gate terminal and the source terminal when the DMFET is in the ON-state.

7. The switch circuit of claim 6, further comprising:
a positive discriminator coupled to the gate driver circuitry, the positive discriminator configured to determine a first positive voltage between a power supply voltage and the first voltage at the first node, wherein the first positive voltage is the greater of the power supply voltage and the first voltage.

8. A device comprising:
a switch circuit comprising:
a depletion-mode field-effect transistor (DMFET) having an ON-state and an OFF-state, wherein the DMFET is configured to couple a first node to a second node in the ON-state, and wherein the DMFET is configured to isolate the first node from the second node in the OFF-state;
a negative charge pump that is coupled to a gate terminal of the DMFET, the charge pump configured to supply a negative charge pump voltage to the gate terminal of the DMFET; and
a negative discriminator coupled to the charge pump, the discriminator configured to compare a first voltage at the first node and a second voltage at the second node and determine the negative charge pump voltage based on the comparison.

9. The device of claim 8, wherein the DMFET comprises a source terminal, and wherein the negative charge pump is configured to supply the negative charge pump voltage to the gate terminal, wherein the voltage between the gate terminal and the source terminal of the DMFET is less than a threshold voltage of the DMFET, to ensure that the DMFET is in the OFF-state.

10. The device of claim 8, wherein the negative discriminator configured to determine the negative charge pump voltage based on a comparison of a first voltage at the first node and a second voltage at the second node is configured to:
determine a first negative voltage between a power supply voltage and the first voltage at the first node, wherein the first negative voltage is the lesser of the power supply voltage and the first voltage; and
determine a second negative voltage between the power supply voltage and the second voltage at the second node, wherein the second negative voltage is the lesser of the power supply voltage and the second voltage.

11. The device of claim 10, wherein the negative discriminator is further configured to:
determine a third negative voltage between the first negative voltage and the second negative voltage, wherein the third negative voltage is the lesser of the first negative voltage and the second negative voltage.

12. The device of claim 8, wherein the DMFET is an n-type metal-oxide-semiconductor FET.

13. The device of claim 8, wherein the DMFET comprises a source terminal, the switch circuit further comprising gate driver circuitry configured to provide a substantially constant voltage between the gate terminal and the source terminal when the DMFET is in the ON-state.

14. The device of claim 13, further comprising:
a positive discriminator coupled to the gate driver circuitry, the positive discriminator configured to determine a first positive voltage between a power supply voltage and the first voltage at the first node, wherein the first positive voltage is the greater of the power supply voltage and the first voltage.

15. A method for operating a switch circuit, the method comprising:
determining a negative charge pump voltage based on a comparison of a first voltage at a first node of a depletion-mode field-effect transistor (DMFET) and a second voltage at a second node of the DMFET, wherein the DMFET has an ON-state and an OFF-state, wherein the DMFET is configured to couple the first node to the second node in the ON-state, and wherein the DMFET is configured to isolate the first node from the second node in the OFF-state;

generating the negative charge pump voltage; and
supplying the negative charge pump voltage to a gate terminal of the DMFET.

16. The method of claim 15, wherein determining the negative charge pump voltage is performed by a negative discriminator, wherein generating the negative charge pump voltage is performed by a negative charge pump, wherein an output of the negative charge pump applies the negative charge pump voltage to a gate terminal of the DMFET, and wherein the DMFET is an n-type metal-oxide-semiconductor FET.

17. The method of claim 15, wherein the DMFET comprises a source terminal, and wherein supplying the negative charge pump voltage to a gate terminal of the DMFET further comprises:
supplying the negative charge pump voltage to the gate terminal, wherein the voltage between the gate terminal and the source terminal of the DMFET is less than a threshold voltage of the DMFET, to ensure that the DMFET is in the OFF-state.

18. The method of claim 15, wherein determining a negative charge pump voltage further comprises:
determining a first negative voltage between a power supply voltage and the first voltage at the first node, wherein the first negative voltage is the lesser of the power supply voltage and the first voltage;
determining a second negative voltage between the power supply voltage and the second voltage at the second node, wherein the second negative voltage is the lesser of the power supply voltage and the second voltage; and
determining a third negative voltage between the first negative voltage and the second negative voltage, wherein the third negative voltage is the lesser of the first negative voltage and the second negative voltage.

19. The method of claim 15, wherein the DMFET comprises a source terminal, the method further comprising:
providing a substantially constant voltage between the gate terminal and the source terminal when the DMFET is in the ON-state.

20. The method of claim 19, wherein providing a substantially constant voltage between the gate terminal and the source terminal comprises:
determining a first positive voltage between a power supply voltage and the first voltage at the first node, wherein the first positive voltage is the greater of the power supply voltage and the first voltage; and
applying the first positive voltage to gate driver circuitry.

* * * * *